(12) United States Patent
Yoon et al.

(10) Patent No.: US 6,218,291 B1
(45) Date of Patent: Apr. 17, 2001

(54) METHOD FOR FORMING CONTACT PLUGS AND SIMULTANEOUSLY PLANARIZING A SUBSTRATE SURFACE IN INTEGRATED CIRCUITS

(75) Inventors: Bo-Un Yoon, Seoul; Seok-Ji Hong, Kyunggi-do, both of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/306,712

(22) Filed: May 7, 1999

(30) Foreign Application Priority Data

May 7, 1998 (KR) ................................ 98-16333

(51) Int. Cl.$^7$ ............................. H01L 21/4763
(52) U.S. Cl. ................... 438/634; 438/631; 438/633; 438/652; 438/653; 438/672
(58) Field of Search ................. 438/631, 672, 438/633, 634, 637, 652, 653

(56) References Cited

U.S. PATENT DOCUMENTS

| 4,676,867 | * | 6/1987  | Elkins et al. ............... 438/699 |
| 5,268,330 | * | 12/1993 | Givens et al. .............. 438/586 |
| 5,328,553 | * | 7/1994  | Poon ......................... 438/633 |
| 5,356,513 | * | 10/1994 | Burke et al. ............... 438/633 |
| 5,545,581 | * | 8/1996  | Armacost et al. .......... 438/631 |
| 5,618,381 | * | 4/1997  | Doan et al. ................ 438/633 |
| 5,665,657 | * | 9/1997  | Lee ........................... 438/624 |
| 5,747,383 | * | 5/1998  | Chen et al. ................ 438/648 |
| 5,786,273 | * | 7/1998  | Hibi et al. ................. 438/637 |
| 5,830,804 | * | 11/1998 | Cleeves et al. ............ 438/672 |
| 5,861,342 | * | 1/1999  | Gabriel et al. ............. 438/631 |
| 5,960,310 | * | 9/1999  | Jeong ........................ 438/622 |
| 5,960,311 | * | 9/1999  | Singh et al. ............... 438/623 |
| 5,961,617 | * | 9/1999  | Jeong ........................ 438/633 |
| 6,025,269 | * | 2/2000  | Sandhu ...................... 438/688 |

* cited by examiner

Primary Examiner—Eddie C. Lee
Assistant Examiner—N. Drew Richards
(74) Attorney, Agent, or Firm—The Law Offices Of Eugene M. Lee, P.L.L.C.

(57) ABSTRACT

A method for forming contact plugs and simultaneously planarizing a substrate surface in an integrated circuit. Initially, a conductive structure is formed on a semiconductor substrate having a plurality of diffusion regions therein. A first insulating layer is formed over the semiconductor substrate including the conductive structure. The first insulating layer is etched using a contact hole forming mask to form a contact hole. A conductive layer is formed on the first insulating layer filling up the contact hole with the conductive layer. The conductive layer is etched until an upper surface of the first insulating layer is exposed. A second insulating layer is formed over the first insulating layer. A contact plug free of voids is formed and simultaneously a substrate surface is planarized by planarization-etching the second and first insulating layers.

13 Claims, 4 Drawing Sheets

METHOD FOR FORMING CONTACT PLUGS AND SIMULTANEOUSLY PLANARIZING A SUBSTRATE SURFACE IN INTEGRATED CIRCUITS

BACKGROUND OF THE INVENTION

1. Field of the Invention

The present invention relates to the manufacture of semiconductor devices. More particularly, the present invention is directed to a novel method for forming contact plugs and simultaneously planarizing a substrate surface in integrated circuits.

2. Description of the Related Art

As integrated circuit devices become more complex, greater numbers of interconnect levels are required to connect the various sections of the device. Generally contact vias are formed between interconnect levels to connect one level to another. When multiple layers of interconnects are used in this manner, however, difficulties arise in forming upper interconnect levels and contact vias due to the uneven topographical features caused by the lower interconnect levels. Thus, the topography of interconnect levels affects the ease of manufacturing of the integrated circuit device.

The uneven topographical features of multiple interconnect levels are caused by forming the various interconnect layers above each other, resulting in the creation of hills and valleys on the surface of the device. Those skilled in the art will recognize it is difficult to get upper interconnect layers to maintain constant cross-sections when crossing over uneven topography. This leads to portions of the interconnect line having a higher current density, leading to electromigration problems and related device failure mechanisms. These step coverage problems can result in voids and other defects in the interconnect signal lines themselves, and in the contact vias formed between interconnect lines.

Examples of other defects in the interconnect signal lines are open-circuits or short-circuits between layers resulting from the uneven topography caused by the various interconnect layers in a multi-layer structure.

Another example of defects in the interconnect signal lines is the use of a conventional method for forming contact plugs in which a very thick layer of insulating material must be grown or deposited on an underlying region (or a semiconductor substrate) to form contact plugs. According to this conventional method, the contact plugs are formed by using a chemical mechanical polishing (CMP) process which is performed immediately after a conductive layer is deposited filling up contact holes or vias formed through the very thick insulating layer. The insulating layer must be made very thick to accommodate the CMP process for forming the contact plugs. When contact holes or vias are formed through the very thick insulating layer, the aspect ratio of the holes or vias is increased. This leads to two other defects. First, voids may be generated when a conductive layer is deposited on the very thick insulating layer filling up the contact holes or vias. Second, the CMP processing time is increased since the insulating layer is very thick.

Therefore, it would be desirable to provide a method for forming contact vias which are free of voids and other defects, and which result in a more planar topography. It is also desirable that such a method not significantly increase the complexity of the manufacturing process.

SUMMARY OF THE INVENTION

The present invention is directed toward providing a method for forming contact plugs in an integrated circuit which reduces the incidence of defects caused by step coverage problems. A feature of the present invention is the formation of a contact plug which results in a more planar topography. Another feature of the present invention is the formation of a contact plug in which the aspect ratio of a contact hole or via formed through an insulating layer is reduced.

Briefly, in accordance with one aspect of the present invention, a method is provided for forming contact plugs in an integrated circuit. Initially, a conductive structure is formed on a semiconductor substrate having a plurality of diffusion regions therein. A first insulating layer is formed over the semiconductor substrate including the conductive structure. The first insulating layer has a higher step at a first region where the conductive structure is formed in a group than at a second region where the conductive structure is not formed. The first insulating layer is etched using a contact hole forming mask to form a contact hole. A conductive layer is formed on the first insulating layer, filling up the contact hole. The conductive layer is etched until an upper surface of the first insulating layer is exposed. A second insulating layer is formed over the first insulating layer. The contact plug is formed and a substrate surface is simultaneously planarized by planarization-etching the second and first insulating layers, and leaving a part of the second insulating layer in the second region. Before formation of the conductive layer, a barrier layer may be further formed on the first insulating layer, both sidewalls and bottom of the contact hole. Also, before formation of the conductive structure, an oxide layer may be further formed between the conductive structure and the semiconductor substrate.

Briefly, in accordance with another aspect of the present invention, there is provided a method for forming a contact plug in an integrated circuit. The method includes forming a conductive structure on a semiconductor substrate. The method further includes forming a first insulating layer over the semiconductor substrate and the conductive structure. The first insulating layer has a greater height in a first region where the conductive structure is formed than in a second region where the conductive structure is not formed. The method further includes etching the first insulating layer to form a contact hole. The method further includes forming a conductive layer on the first insulating layer and in the contact hole. The method further includes etching the conductive layer until an upper surface of the first insulating layer is exposed. The method further includes forming a second insulating layer over the first insulating layer. The method further includes planarization-etching the second and first insulating layers to form a contact plug and to planarize the second and first insulating layers.

Briefly, in accordance with another aspect of the present invention, there is provided an integrated circuit. The integrated circuit includes a conductive structure, a first insulating layer, a conductive material, and a second insulating layer. The conductive structure is on a semiconductor substrate. The first insulating layer is formed on the semiconductor substrate and the conductive structure, and the first insulating layer has a greater height in a first region where the conductive structure is formed than in a second region where the conductive structure is not formed. There is a contact hole formed in the first insulating layer, and the conductive material fills at least part of the contact hole to form a contact plug. The second insulating layer is formed on the first insulating layer, and the second insulating layer is planarization-etched to planarize the contact plug and the second and first insulating layers.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Korean application no. 98-16333, filed on May 7, 1998, discloses the same subject matter as the present application and is hereby incorporated by reference as if fully set forth herein.

The process steps and structures described below do not form a complete process flow for manufacturing integrated circuits. The present invention can be practiced in conjunction with integrated circuit fabrication techniques currently used in the art and only as much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1A:
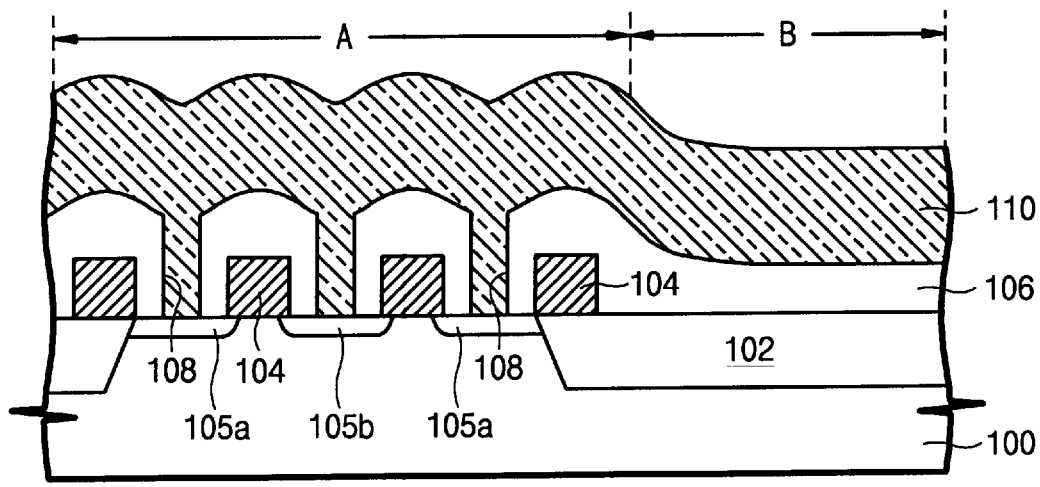
FIGS. 1A to 1D are cross-sectional diagrams showing the formation of contact plugs and simultaneous planarizing of a substrate surface according to a first embodiment of the present invention.

Referring to FIGS. 1A through 1D, the first preferred embodiment will be described wherein contact plugs are be formed to electrically connect two conductive layers with an interlayer insulating layer interposed therebetween and a substrate surface will be simultaneously planarized during fabrication. Referring now more particularly to FIG. 1A, a conductive layer 110, typically made of polysilicon, is formed on an underlying region 100, filling a contact hole 108 in an integrated circuit.

The underlying region 100 can be either a semiconductor substrate, an interconnect signal line, or other base layer, and the other features formed on the underlying layer 100 may be a wide variety of features typically forming a semiconductor device. For example, the underlying region 100 may be a semiconductor substrate, and this substrate may have a device isolation region 102, as shown in FIG. 1A, to define active and inactive regions thereon. The device isolation region 102 is formed, for example, by a shallow trench isolation (STI) method. A gate electrode 104, which can be used as a word line of a semiconductor memory device, may be formed on the substrate 100 with a gate oxide layer (not shown) grown or deposited therebetween. Diffusion regions of, for example, source and drain regions 105a and 105b of the memory device, can also be within the active region at both sides of the gate electrode 104. The contact plug is typically used to electrically connect top and bottom interconnect lines in a multi-layer structure, or each of the diffusion regions and an interconnect line.

A first insulating layer 106 may be deposited over the substrate 100, including the gate electrode 104. The first insulating layer 106 need not be very thick because of the subsequent chemical mechanical polishing (CMP) processing used to form the contact plugs, and this also reduces the CMP processing time. The first insulating layer 106 can be thinner because it is not planarization-etched immediately after its formation to form the contact plugs, but rather the contacts plugs are formed by a later CMP process. It should be noted that the CMP process is well known in the art and the details of this process have been omitted for brevity.

The insulating layer 106 can typically be made of silicon oxide (SiO$_2$), or alternately from undoped silicate glass (USG), boro-phospho silicate glass (BPSG), phospho silicate glass (PSG), SiN, SiON, SiOF, or a composite of these materials, by using a chemical vapor deposition (CVD), a reflow, a deposition/etch, and a high density plasma (HDP) method. The insulating layer 106 can also be made of a material selected from a group consisting of SOG, flowable oxide (FOX), polymer, or a composite of these materials, by using a spin-coating method. Other suitable materials and methods may also be used.

Referring to FIG. 1A, a photoresist mask (not shown) is deposited on the insulating layer 106 and patterned, and an etching process is performed using the patterned photoresist mask to form an opening (i.e., the contact hole 108) through the insulating layer 106 where a contact plug is to be made. Conductive layer 110, typically made of polysilicon, is deposited on the insulating layer 106, filling up the contact hole 108. Instead of polysilicon, the conductive layer 110 can be formed of tungsten (W), aluminum (Al), copper (Cu), titanium (Ti), TiN, W—Si, Al—Cu, or Al—Cu—Si, by using a CVD, a physical vapor deposition (PVD), a reflow, or a force fill method. In this embodiment, the conductive polysilicon layer will be described hereinafter as an example.

Figure 1B:
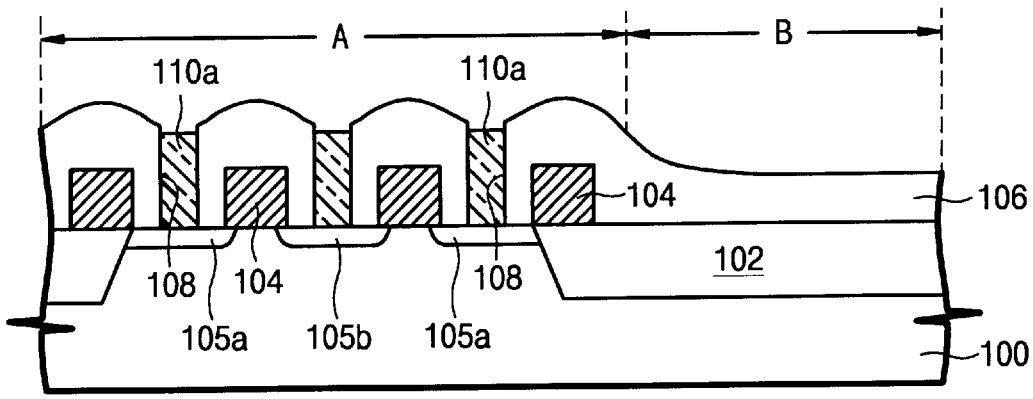

FIG. 1B illustrates the integrated circuit after an etch-back process is performed to form a polysilicon contact plug. The conductive polysilicon layer 110 is wet or dry etched back until an upper surface of the insulating layer 106 is entirely exposed, and thereby the polysilicon contact plugs 110a are formed. The region 'A' where the gate electrodes are formed (i.e., the rugged surface) is higher than region 'B' where the gate electrodes are not formed. This results in an uneven topography due to the creation of hills and valleys on the substrate surface. Particularly, since the insulating layer 106 of the region 'B' is thinner than that of the region 'A', the uneven topography is most pronounced at the interface between the regions 'A' and 'B'. According to this embodiment, in order to remove this uneven topography of the substrate surface, deposition and planarization of an insulating layer 112 formed on the first insulating layer 106 is performed, as shown in FIGS. 1C and 1D.

Alternatively, the conductive polysilicon layer 110 may be over-etched. The polysilicon contact plug 110a thus formed is recessed with respect to the first insulating layer 106. Then a CMP process for planarization may be performed.

Figure 1C:
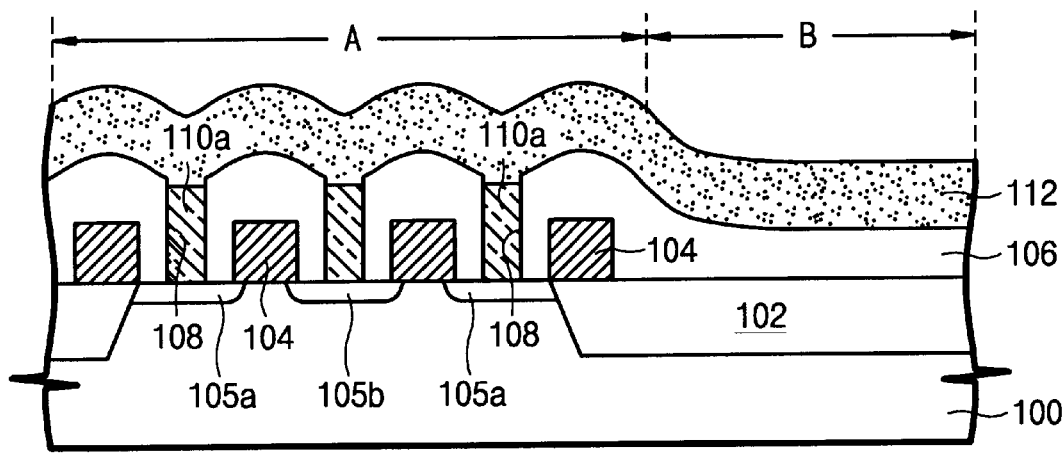

Referring to FIG. 1C, a second insulating layer 112 is deposited on the first insulating layer 106 and the polysilicon contact plugs 110a. The second insulating layer 112 is preferably made of the same material as that of the first insulating layer 106, or that of an interlayer insulating layer to be formed thereon later.

Figure 1D:
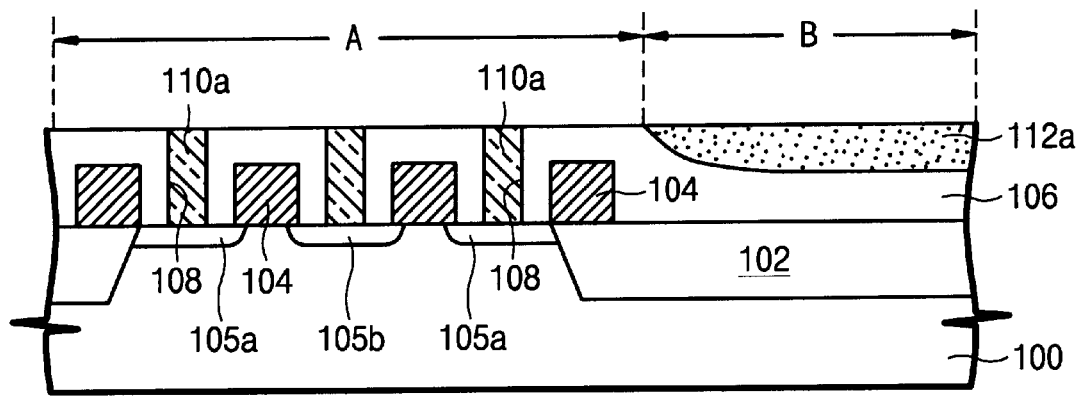

Finally, as shown in FIG. 1D, the CMP process is performed until an upper surface of the polysilicon contact plug 110a is exposed. Part 112a of the second insulating layer 112 remains in the 'B' region where valleys are located. The CMP process uses a slurry as a polishing material which has an etch selectivity of the conductive polysilicon layer 110 with respect to the insulating layers 106 and 112. This etch selectivity is preferably between 10:1 and 1:10. Most preferably, the etch selectivity is between 10:1 and 1:1. The contact plug 110a acts as an etch stop during the CMP process. Another feature of this embodiment is, therefore, that the CMP process is performed to form the contact plug 110a after the valleys of the uneven substrate surface are filled up with the second insulating layer 112. As a result, according to the present invention, the contact plug 110a is completely formed and at the same time the substrate surface is planarized by means of the part 112a of the second insulating layer remaining in the 'B' region.

Also, there is no need for the first insulating layer 106 to be formed very thick to accommodate the subsequent CMP process for formation of the contact plugs. That is, the first insulating layer 106 of the present invention can be formed having an appropriate thickness less than required by the prior art methods. This reduced thickness results in less CMP processing time required to form the contact plugs. furthermore, because the first insulating layer 106 is formed so that it is comparatively thin, the aspect ratio of the contact hole or via can be reduced. This results in contact plugs that are formed free of voids.

Figure 2A:
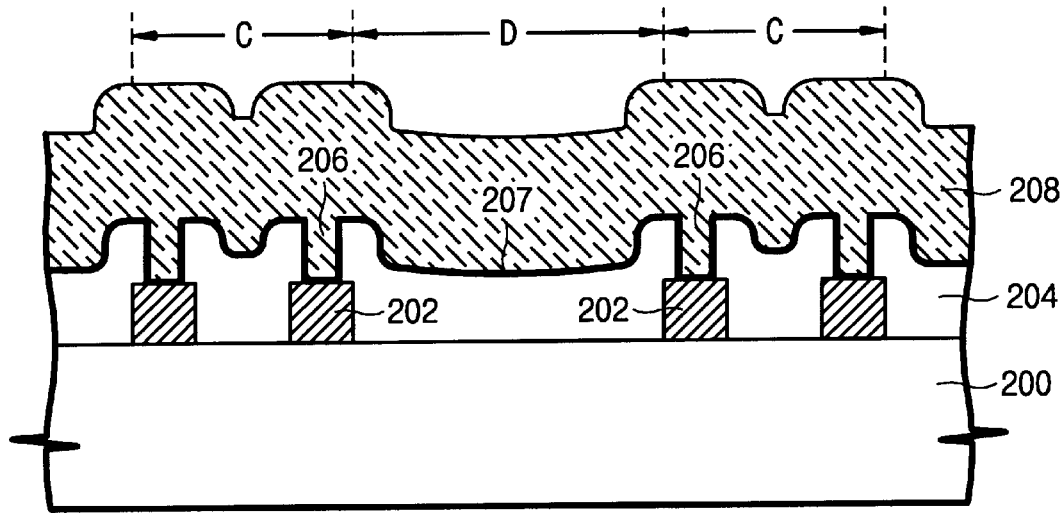
FIGS. 2A to 2D are cross-sectional diagrams showing the formation of contact plugs and simultaneous planarizing of a substrate surface according to a second embodiment of the present invention.

FIGS. 2A through 2D illustrate a novel method for forming contact plugs and simultaneously planarizing a substrate surface in integrated circuits according to a second embodiment of the present invention. Referring to FIG. 2A, an interconnect line 202 of, for example, metal is to be formed on an underlying region 200 in an integrated circuit. The underlying region 200 can be either a semiconductor substrate or an interconnect signal line. A first insulating layer 204 having a thickness is deposited over the underlying region 200, including the interconnect line 202. The insulating layer 204 has a proper thickness to reduce subsequent CMP processing time, as in the first embodiment. The interconnect line 202 is used to electrically connect multi-level interconnect lines, e.g., the underlying region 200 with a contact plug to be formed thereon later. The insulating layer 204 can typically be made of silicon oxide (SiO$_2$), but may instead be made of undoped silicate glass (USG), boro-phospho silicate glass (BPSG), phospho silicate glass (PSG), SiN, SiON, SiOF, or a composite of these materials, by using a chemical vapor deposition (CVD), a reflow, a deposition/etch, or a high density plasma (HDP) method. The insulating layer 204 can also be made of SOG, flowable oxide (FOX), polymer, or a composite of these materials, by using a spin-coating method. Other suitable materials and methods may also be used.

It is a feature of this embodiment that the insulating layer 204 need not be very thick because of the subsequent chemical mechanical polishing (CMP) processing used to form the contact plugs. The first insulating layer 204 can be thinner because it is not planarization-etched immediately after its formation to form the contact plugs, but rather the contacts plugs are formed by a later CMP process.

Referring again to FIG. 2A, a photoresist mask (not shown) is then deposited on the insulating layer 204 and patterned, and an etching process is performed using the patterned photoresist mask to thereby form a via (i.e., a contact hole 206) through the insulating layer 204 where a contact plug is to be made. The contact hole 206 is formed through the insulating layer 204 and on the interconnect line 202. A barrier layer 207, typically made of TiN, is formed on the insulating layer 204 and on both the sidewalls and the bottom of the contact hole 206. This is done to improve the contact resistance with a contact plug to be formed later, to restrain a reaction between the interconnect line 202 and the contact plug, and to improve adhesion to the contact plug. Instead of TiN, the barrier layer 207 can be made of Ti, Ta, TaN, WN, TiSiN, or other suitable materials.

A conductive layer 208, typically made of tungsten (W), is then coated on the barrier layer 207, filling up the contact hole 206. Instead of tungsten, the conductive layer 208 can be formed of Al, Cu, Ti, TiN, polysilicon, W—Si, Al—Cu, Al—Cu—Si, or other suitable material, by using a CVD, a PVD, a reflow, or a force fill method. In this embodiment, the conductive tungsten layer will be described hereinafter as an example.

Figure 2B:
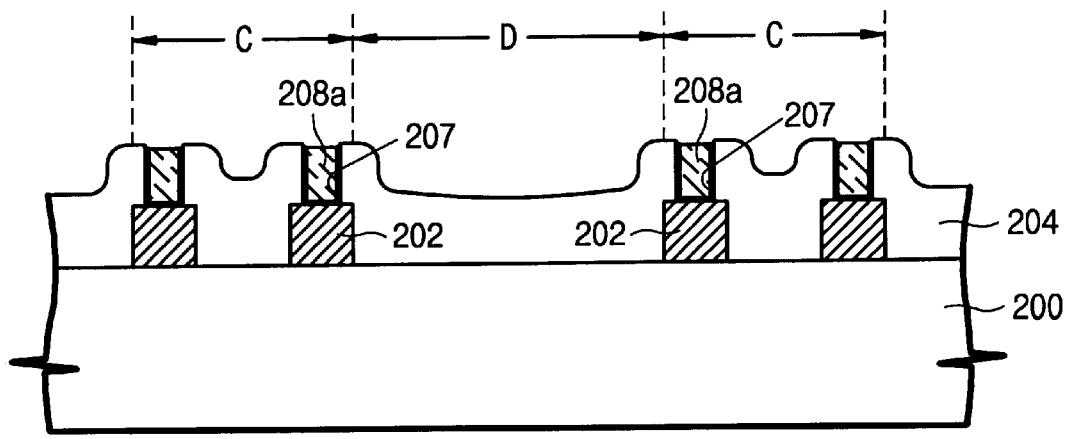

FIG. 2B illustrates the integrated circuit after an etch-back process is performed to form a contact plug. The conductive tungsten layer 208 is wet or dry etched back, followed by removal of the TiN barrier layer 207. The etch-back process continues to be performed until an upper surface of the insulating layer 204 is entirely exposed, and thereby the tungsten contact plug 208a is formed. In the etch-back process, it is preferable that part of the TiN barrier layer 207 does not remain in the recessed area, i.e., the 'D' region. The insulating layer 204 is higher in a region 'C' where the space between the two adjacent interconnect lines 202 is small, as compared with a region 'D' where the space between the two adjacent interconnect lines 202 is great, as shown in FIG. 2A. Also since the insulating layer 204 of the region 'D' is thinner than that of the region 'C', the uneven topography is more pronounced at the interface between the regions 'C' and 'D'. Thus, so as to remove the uneven topography of the substrate surface, deposition and planarization of an insulating layer on the first insulating layer 204 must be performed, as shown in FIGS. 2C and 2D.

Figure 2C:
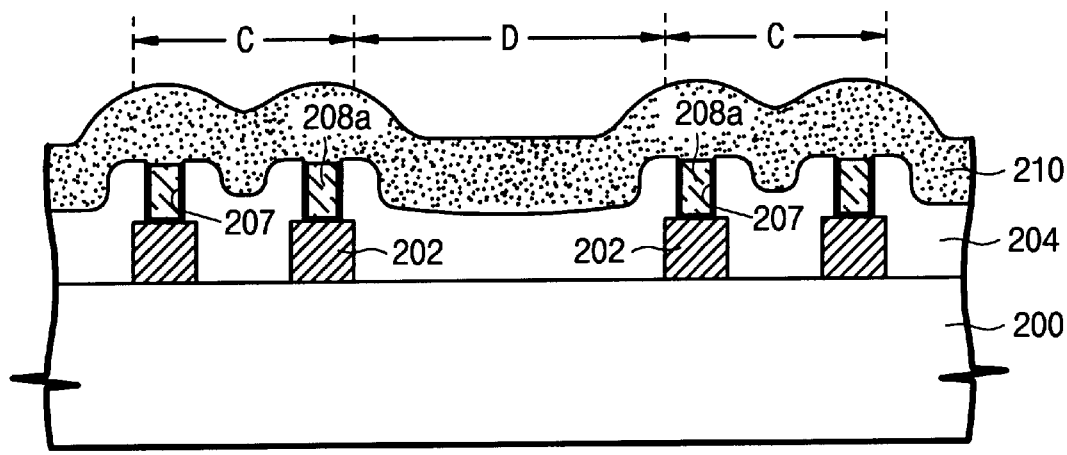

Referring to FIG. 2C, after the etch-back of the conductive tungsten layer 208 and the TiN barrier layer 207 is performed, a second insulating layer 210 is deposited on the first insulating layer 204 and the contact plugs 208a. The second insulating layer 210 can be preferably made of the same material as that of the first insulating layer 204 or that of an insulating layer to be formed thereon later.

Figure 2D:
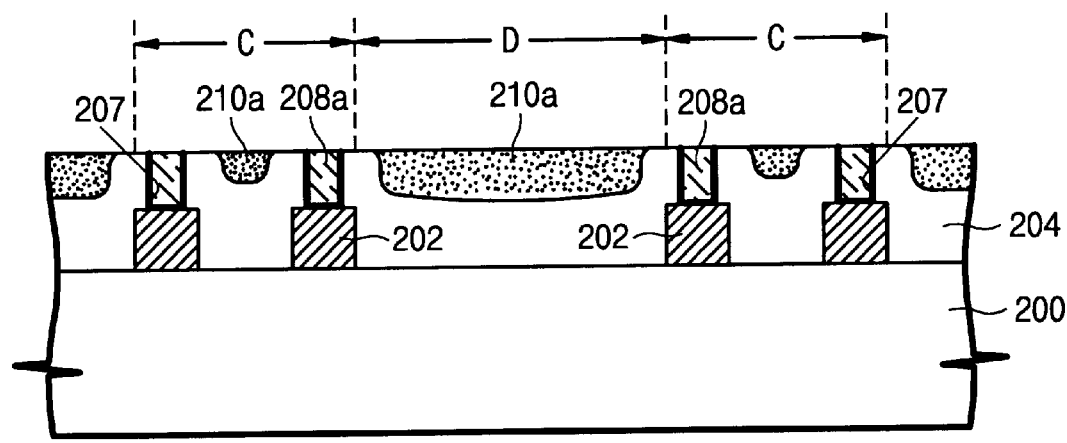

Following planarization of the second insulating layer 210, a device structure as shown in FIG. 2D is formed. As can be seen, the device structure depicted in FIG. 2D is similar to the device structure shown in FIG. 1D in that substrate surfaces are planarized. This planarization of the second insulating layer 210 can be achieved using a CMP process until an upper surface of the contact plug 208a is exposed. The CMP process uses a slurry having low selectivity so as to simultaneously polish the insulating layers and the conductive tungsten plug. As a result, parts 210a of the second insulating layer 210 remain in the 'C' and 'D' regions where recessed areas are located with respect to the contact plug 208a. Therefore, the contact plug 208a is completely formed and the substrate surface is simultaneously planarized by means of the remaining parts 210a of the second insulating layer. Another feature of this embodiment is that, after the valleys in the uneven substrate surface are filled up with the second insulating layer 210, the CMP process is performed to form the contact plugs 208a. Although not mentioned in the above, those skilled in the art will recognize that the operational effects of the second embodiment are similar to those of the first embodiment.

Thus, a method for forming contact plugs and simultaneously planarizing a substrate surface in integrated circuits, as well an integrated circuit produced with such a method, has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for forming a contact plug in an integrated circuit, comprising:

forming a conductive structure on a semiconductor substrate having a plurality of diffusion regions therein;

forming a first insulating layer over the semiconductor substrate including the conductive structure, the first insulating layer having a higher step at a first region where the conductive structure is formed in a group than at a second region where the conductive structure is not found;

after forming the first insulating layer, etching the first insulating layer using a contact hole forming mask to form a contact hole;

after etching the first insulating layer, forming a conductive layer filling the contact hole on the first insulating layer;

etching the conductive layer until an upper surface of the first insulating layer is exposed;

forming a second insulating layer over the first insulating layer; and planarization-etching the second and first insulating layers to form a contact plug and simultaneously to planarize a substrate surface by leaving a part of the second insulating layer in the second region.

2. The method of claim 1, wherein the contact hole is formed through the first insulating layer and on the semiconductor substrate.

3. The method of claim 2, wherein the contact hole is formed on each of the diffusion regions in the semiconductor substrate.

4. The method of claim 1, wherein the contact hole is formed through the first insulating layer and on the conductive structure.

5. The method of claim 4, further comprising forming, before formation of the conductive layer, a barrier layer on the first insulating layer and on both sidewalls and a bottom of the connect hole.

6. The method of claim 5, wherein the barrier layer comprises a material selected from a group consisting of Ti, TiN, Ta, TaN, WN, TiSIN, and a composite material thereof.

7. The method of claim 1, wherein the contact hole is formed on the conductive structure and on each of the diffusion regions in the semiconductor substrate.

8. The method of claim 1, wherein the second insulating layer comprises the same material as the first insulating layer.

9. The method of claim 1, further comprising forming, before formation of the conductive structure, an oxide layer between the conductive structure and the semiconductor substrate.

10. The method of claim 1, wherein the planarization-etching is performed with a chemical mechanical polishing process.

11. A method for forming a contact plug in an integrated circuit, comprising:

forming a conductive structure on a semiconductor substrate;

forming a first insulating layer over the semiconductor substrate and the conductive structure, the first insulating layer having a greater height in a first region where the conductive structure is formed than in a second region where the conductive structure is not formed;

after forming the first insulating layer, etching the first insulating layer to form a contact hole;

after etching the first insulating layer, forming a conductive layer on the first insulating layer and in the contact hole;

etching the conductive layer until an upper surface of the first insulating layer is exposed;

forming a second insulating layer over the first insulating layer; and planarization-etching the second and first insulating layers to form a control plug and to planarize the second and first insulating layers.

12. The method of claim 11, wherein a part of the second insulating layer remains in the second region after the planarization-etching of the second and first insulating layers; and the first insulating layer is too thin at the second region, without the second insulating layer, to allow a planarization-etch to form the contact plug.

13. The method of claim 11, wherein the planarization-etching is performed with a chemical mechanical polishing process.

* * * * *